US009589718B2

(12) United States Patent
Yang et al.

(10) Patent No.: US 9,589,718 B2
(45) Date of Patent: Mar. 7, 2017

(54) METHOD FOR REDUCING OR ELIMINATING CONDUCTED COMMON MODE NOISE IN A TRANSFORMER

(71) Applicant: Virginia Tech Intellectual Properties, Inc., Blacksburg, VA (US)

(72) Inventors: Yuchen Yang, Blacksburg, VA (US); Daocheng Huang, Blacksburg, VA (US); Qiang Li, Blacksburg, VA (US); Fred C. Lee, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 459 days.

(21) Appl. No.: 13/888,743

(22) Filed: May 7, 2013

(65) Prior Publication Data

US 2014/0334198 A1 Nov. 13, 2014

(51) Int. Cl.
*G01R 31/28* (2006.01)
*H01F 27/36* (2006.01)
*H01F 27/28* (2006.01)

(52) U.S. Cl.
CPC ....... *H01F 27/362* (2013.01); *H01F 27/2804* (2013.01); *Y10T 29/4902* (2015.01)

(58) Field of Classification Search
CPC .. H01F 27/2823; H01F 27/2885; H01F 27/33; H01F 27/36; H01F 27/362; H01F 27/385; H02M 1/12; H02M 1/44; H03H 2001/0092; Y10T 29/4902; Y10T 29/49071; Y10T 29/49073; Y10T 29/49128; Y10T 29/4913; Y10T 29/49155; Y10T 29/49169
USPC ...... 29/602.1, 605, 606, 831, 846, 850, 854; 336/65, 83, 84 R, 84 C, 84 M, 200, 206; 363/21.12
See application file for complete search history.

(56) References Cited

U.S. PATENT DOCUMENTS 4,089,049 A * 5/1978 Suzuki .................... H01F 27/36 307/91
7,868,724 B2 * 1/2011 Sicong .................. H01F 27/362 336/84 R

* cited by examiner

*Primary Examiner* — Paul D Kim
(74) *Attorney, Agent, or Firm* — Whitham, Curtis & Cook, P.C.

(57) ABSTRACT

At least one shield member interposed between primary and secondary windings of a transformer and connected to the primary and/or secondary windings forms a distributed parasitic capacitance between the shield member and either the winding to which it is not connected or another shield member connected to that winding. Connections are made to the respective transformer windings such that the voltage distributions thus developed cause complementary common mode noise to be conducted in opposite directions in respective portions of the parasitic capacitance such that net common mode current can be made arbitrarily small without requiring that both sides of the distributed parasitic capacitance have complementary or equal voltage distributions. Such complementary common mode currents can be achieved by dividing opposing shield members or developing a voltage distribution in a single shield member in accordance with Faraday's Law.

7 Claims, 9 Drawing Sheets

Cross Section View

METHOD FOR REDUCING OR ELIMINATING CONDUCTED COMMON MODE NOISE IN A TRANSFORMER

FIELD OF THE INVENTION

The present invention generally relates to shielding for reducing or preventing the coupling of noise through a transformer and, more particularly, to shielding for reducing or preventing coupling of common mode (CM) noise through a transformer included in a power converter.

BACKGROUND OF THE INVENTION

Electrical power is generally distributed as high voltage alternating current (AC) even though many electrically powered devices operate at a substantially constant, relatively low voltage, referred to as direct current (DC) since use of high voltage allows power to be delivered over large distances with low losses over power lines of reduced cross-section and containing less conductive material while use of AC allows the voltage to be reduced to a desired voltage level using simple transformers. Therefore, other than devices designed to operate from AC power or DC power supplied only from a battery, virtually all devices designed to operate from DC power include an AC-DC power converter, often including voltage regulation. Many devices may require DC power at a plurality of different voltages and thus will generally include DC-DC power converters, as well.

To obtain acceptable efficiency, both AC-DC and DC-DC power converters of current design rely on switching to develop desired voltage levels with sufficient accuracy while accommodating potentially large transients in current that may be drawn by a load. Data processing devices and digital logic circuits that are included in various devices as controls therefor also function by switching. Switching circuits, regardless of the purpose they are intended to serve, inherently produce noise as the switches change state and such switching noise may be propagated back to the power source such as a local power distribution system and be coupled to other devices receiving power from the same source. Switching noise generally contains an unpredictable range of frequency components which can include very high frequencies that may have unpredictable effects in any device that it reaches. For example, high frequency components can be capacitively coupled to signal lines in a logic circuit and cause incorrect operation.

Switching noise may also contain common mode (CM) and differential mode (DM) components. While filtering can reduce the magnitude of switching noise, CM noise components appear as currents in the same direction in both the supply and return paths of a circuit. Common mode noise can be easily transmitted through the parasitic capacitance between primary and secondary windings of a transformer. CM noise is a particular problem in power converters that also provide voltage isolation between the power source and load since current in the same direction on both the supply and return paths will cause the powered device to “float” relative to the power source. Therefore, it has been common in some transformer designs to provide shielding between the primary and secondary windings of some transformers intended for critical applications. However, known types of shielding arrangements have not been particularly effective in holding CM noise to acceptable levels and, in any event, such shielding has been difficult to apply to some transformer designs, particularly in transformers suitable for high power density power converters where one or more of the transformer windings is formed of a pattern of conductive material on a printed circuit board (PCB) or other substrate (collectively referred to as PCB windings) that provides support for other power converter components. Common mode noise can also be coupled through other structures such as heat sinks and ground planes where a parasitic capacitance exists between portions of a transformer and such a structure.

SUMMARY OF THE INVENTION

It is therefore an object of the present invention to provide shielding method and structure applicable to any transformer design for any application, including transformers with PCB windings, and which can greatly reduce or fully eliminate propagation of common mode noise through parasitic capacitance between transformer windings and between a transformer and other structures.

In order to accomplish this and other objects of the invention, a transformer or power converter including an isolation transformer is provided wherein the transformer includes a shielding arrangement for reducing or avoiding transmission of common mode noise between windings of a transformer, said transformer comprising a first winding, a second winding magnetically linked to the first winding, and a shield element interposed between the windings of the transformer, the shield element being connected to the first winding of the transformer and having a voltage distribution along a length of the shield element that causes common mode currents between said shield element and another shield element or said second winding of said transformer to be substantially complementary and resulting in substantially zero net common mode current in a parasitic capacitance formed by the shield element and another winding or a further shield element.

In accordance with another aspect of the invention, a method is provided for reducing or eliminating conducted common mode noise in a transformer is provided comprising steps of interposing a shield member between the primary and secondary windings of the transformer, developing a voltage distribution in the secondary winding or a further shield member interposed between the shield member and the secondary winding, and connecting the shield member to the primary winging such that a voltage distribution is developed in the shield member wherein the voltage distribution in the shield member and a voltage distribution in the secondary winding or a further shield member causes substantially complementary currents in a parasitic capacitance between the shield member and the secondary winding or the further shield member.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
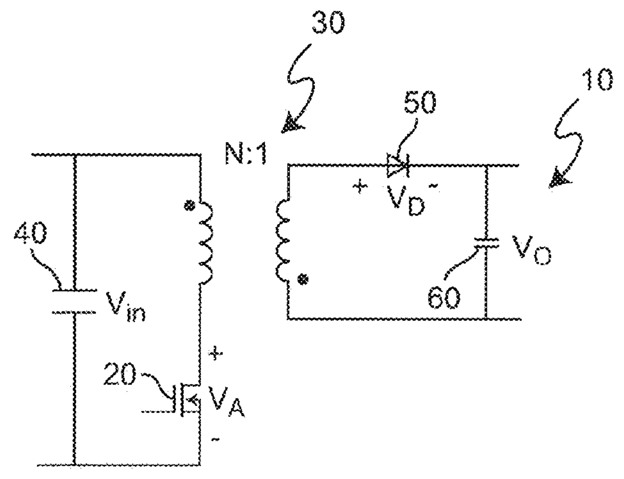
Figure 1 RELATED ART
FIG. 1 is a schematic diagram of a model of an exemplary flyback converter topology useful for explaining application of the invention to power converters of the same or other topologies.

Referring now to the drawings, and more particularly to FIG. 1, there is shown a schematic diagram of an exemplary so-called flyback topology power converter 10. The flyback topology is illustrated as being an extremely simple and widely used DC/DC power converter topology that uses a transformer for isolation between input and output sides as is done in many other known power converter topologies. Therefore, a flyback topology will be used to explain the invention; in view of which, application to all other known or foreseeable topologies using a transformer will be evident to those skilled in the art. However, it is to be understood that no particulars of any illustration of any flyback topology circuit in any Figure is admitted to be prior art in regard to the present invention since the depictions thereof are arranged to facilitate conveyance of an understanding of the present invention.

Figure 2:
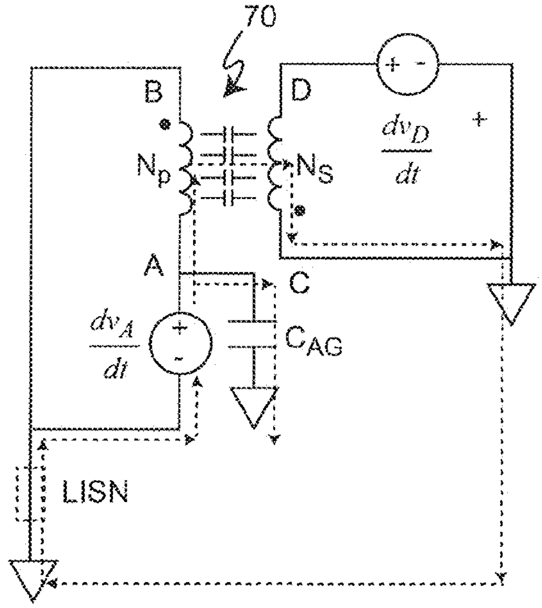
FIG. 2 is a schematic diagram of a common mode (CM) noise model of the flyback converter topology of FIG. 1.

The flyback power converter topology operates by using a switch 20 in series with a primary winding of transformer 30 to alternatively conduct and interrupt current from a power source 40, depicted here as a DC power source that may or may not provide regulation of voltage $V_{in}$, such as a battery or filtered output of a rectifier circuit receiving AC power input. The voltage waveform in the transformer will thus be a nearly square waveform with the positive-going and negative-going transitions being determined principally by the magnetizing inductance of the transformer and with the voltage appearing on the secondary winding being determined by the turns ratio, here indicated to be N:1. The secondary winding waveform is then rectified by diode 50 and preferably filtered by, for example, capacitor 60. The noise generated in the flyback converter is thus due to the switching functions of switch 20 and diode 50 which are modeled as voltage sources in FIG. 2 which also illustrates the parasitic capacitance, $C_{AG}$, of switch 20 and a line impedance stabilizing network (LISN) connecting the primary side of the converter to ground as is typically used in conducting noise measurements. The secondary side of the converter is also depicted as being grounded. Since, as alluded to above, CM noise causes the output side of the converter to tend to float relative to the input side, current will be conducted through the common ground connection of the input and output sides of the converter.

In practical applications, the magnitude of the switching noise must be held within closely defined limits for electromagnetic interference (EMI) for which industry standards are prescribed. The common mode (CM) component of the switching noise is dominated by the displacement current generated by the voltage pulses in the transformer current and the parasitic capacitance and diode 50. In isolated converters (e.g. converters using a transformer for isolation), the two major components of CM noise are conducted by the distributed parasitic capacitance 70 between the primary and secondary windings of the transformer, illustrated in FIG. 2 as a plurality of disconnected capacitors, and the parasitic capacitance, $C_{AG}$, between switch 20 and ground that may be due to various capacitive coupling effects such as from a converter component to a heat sink and/or connections on a printed circuit board (PCB) or other wiring.

It will be recalled by those conversant with the physics of electrical components that even though the plates of a capacitor are not connected and that an ideal capacitor will have an infinite resistance and no charge carriers will actually flow through an ideal capacitor, as an ideal capacitor is charged, electrons will flow into one of the capacitor terminals and one of the opposing capacitor plates and produce an electrical field that will repel electrons in the other opposing capacitor plate which will then flow out of the other capacitor terminal. When the capacitor is being discharged an opposite effect occurs. Therefore, while the voltage across a capacitor is varying, there appears to be a current passing through the capacitor which is essentially the mechanism of conduction of common mode noise current through a transformer. Numerous efforts and approaches have been made toward reducing the conducted CM noise such as use of an additional compensation circuit, a shield winding in series with the primary transformer winding or partial shielding between the primary and secondary transformer windings. However, these and other methods merely serve to reduce the conducted CM noise and, in at least the case of partial shielding, requires accurate control of parasitic capacitance which is difficult and time-consuming in a production manufacturing environment.

Figure 3:
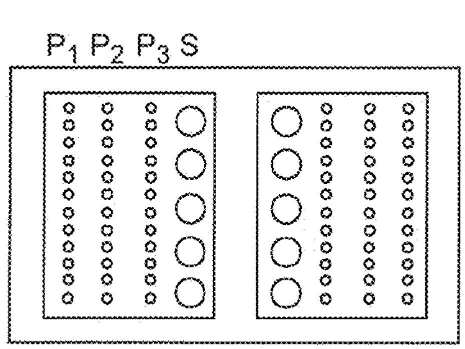
FIG. 3 is a schematic diagram of an exemplary transformer structure to which the invention may be applied.
Figure 4:
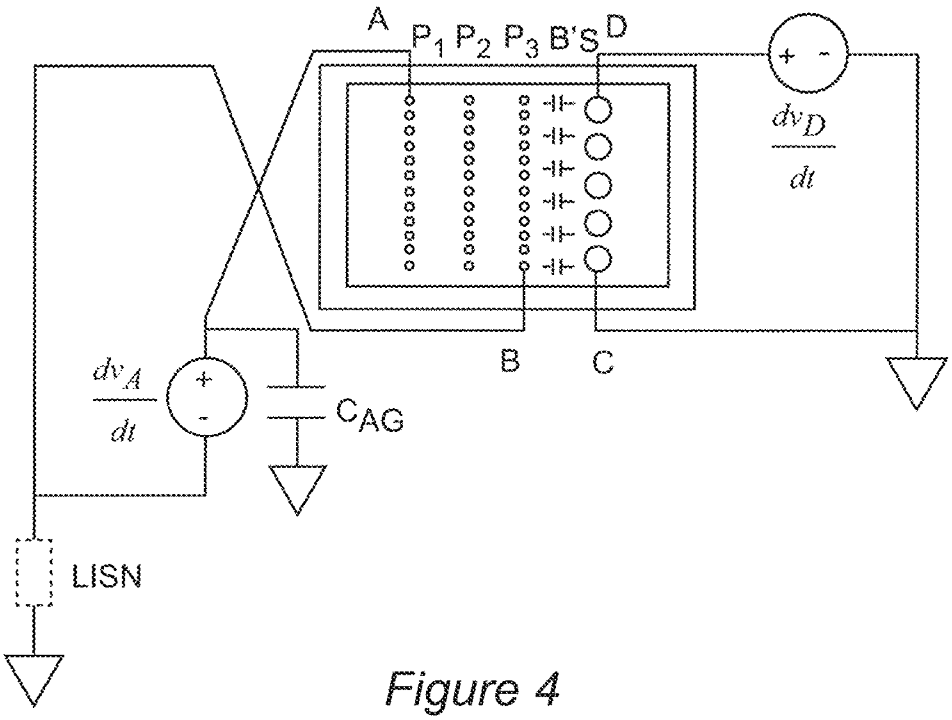
FIG. 4 illustrates applicability of an exemplary transformer structure (e.g. of FIG. 3) to the CM noise model of FIG. 2, FIG. 5 graphically illustrates the voltage distribution in the primary and secondary windings of the exemplary transformer of FIG. 3 or 4.
Figure 5:
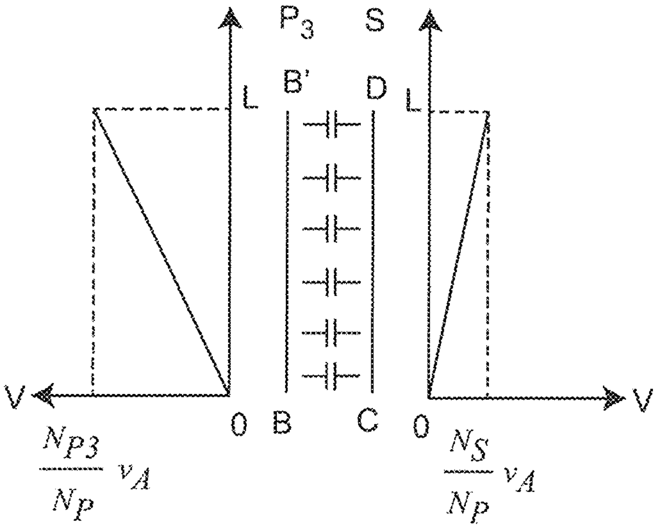
FIG. 5A illustrates application of shielding to the transformer of FIG. 3 or 4.

Referring now to FIGS. 3-5, an improved method of balancing or canceling conduction of CM noise current in a transformer in accordance with the present invention will now be discussed. It should be appreciated in the following discussion, including the discussion of the special case of application of the invention to single turn printed circuit board (PCB) windings, that references to primary and secondary transformer windings should be regarded as interchangeable since transformer effects are entirely symmetrical in an ideal transformer.

As shown in the schematic, cross-sectional view of an exemplary, generic transformer structure of FIG. 3, the transformer core is depicted as outline 90. The configuration of the core is substantially irrelevant to an understanding or the practice of the invention. Further, as with FIG. 1, no portion of any depiction of any exemplary transformer structure is admitted to be prior art in regard to the present invention, regardless of whether or not the invention is included in a given Figure containing such depiction.

Figure 5A:
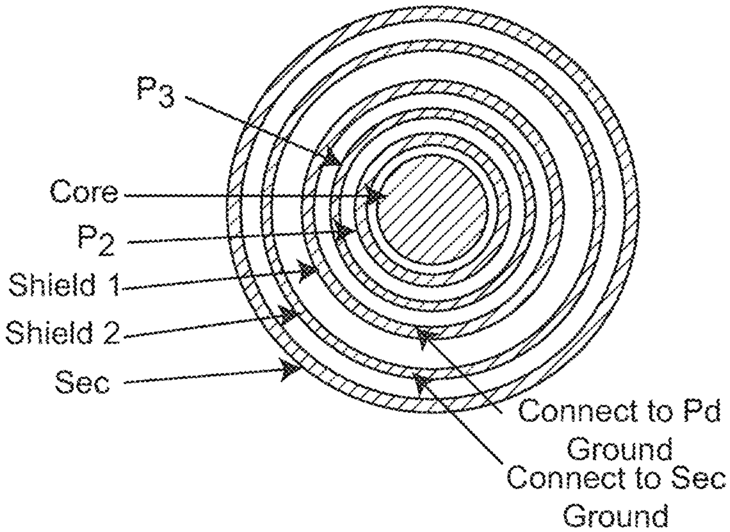

As illustrated, the exemplary transformer depicted in FIG. 3 has three layers of primary winding, $P_1$, $P_2$ and $P_3$ and secondary winding S. Due to the layering of the primary winding, the parasitic capacitance will primarily exist (or a lumped capacitance may be considered to exist) between the secondary winding S and the layer of primary winding, $P_3$, closest to it, as shown in the depiction of FIG. 4 in which only the left half of the transformer of FIG. 3 is shown, for simplicity of illustration. As alluded to above, the CM model of a flyback topology converter is also shown in FIG. 4. In order to calculate the CM noise current that is conducted through the inter-winding capacitance of the transformer, the voltage distribution across secondary winding (C-D) and the innermost primary winding (B-B') are schematically depicted in FIG. 5. Since the voltage distributions are unequal, it can be qualitatively concluded that CM noise current will be conducted whether or not shielding is applied as shown in FIG. 5A since the parasitic inter-winding capacitance of the transformer will be charged and discharged as transformer current varies (and, if shielding is applied, the parasitic capacitance between the two shielding layers will be similarly charged and discharged). The CM noise current can be quantitatively calculated as $$i_{Cm}=\Sigma C\, dv/dt \tag{1}$$

Figure 6:
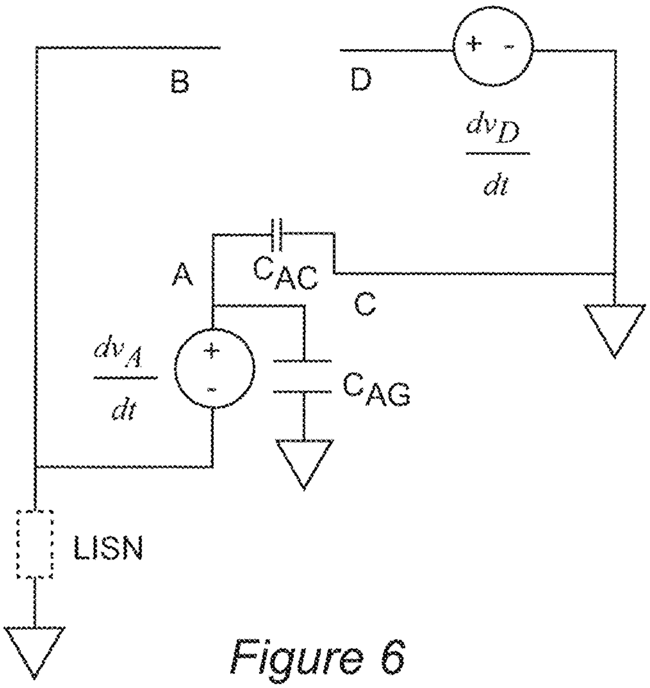
FIG. 6 is a schematic diagram of a lumped CM model applied to a flyback converter topology.
Figure 7:
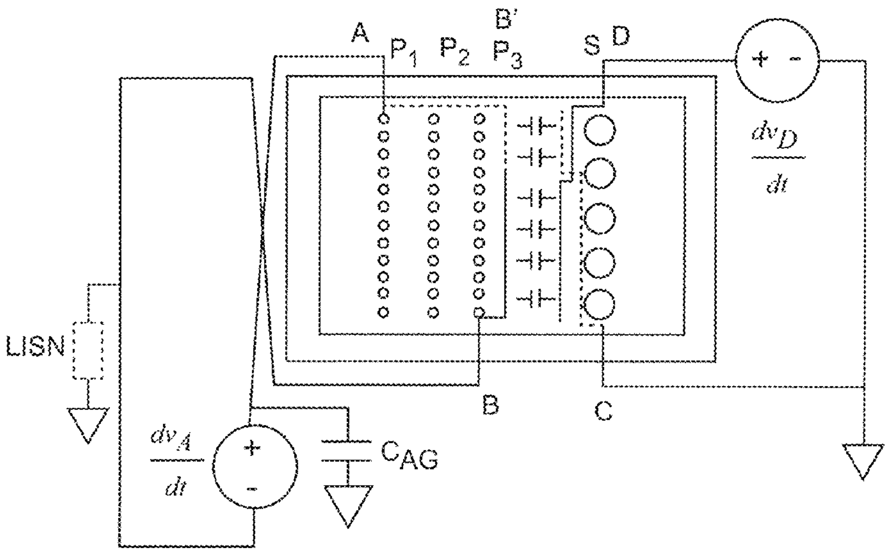
FIG. 7 illustrates application of double shielding in accordance with the invention to an exemplary flyback converter topology.

The lumped inter-winding parasitic capacitance, $C_{AC}$, can then be computed as $$C_{AC}=((N_{P3}-N_S)/2N_P)C_{PS} \tag{2}$$

where N is the number of turns of the winding denoted by the subscript (e.g. $N_P$ is the total number of primary winding turns and $C_{PS}$ is the total actual inter-winding capacitance of the transformer which can be measured or calculated. The lumped CM noise model of the flyback converter is illustrated in FIG. 6 from which it can readily be seen that $C_{AC}$ and $C_{AG}$ are in parallel such that their respective effects reinforce each other. For this reason, among others, shielding between the primary and secondary windings in accordance with known shielding techniques cannot be fully effective to prevent CM noise current.

Figure 8:
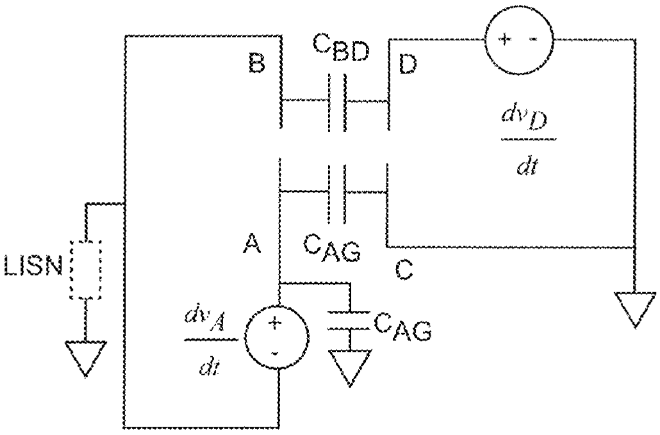
FIG. 8 is a schematic diagram of the structure of FIG. 7.
Figure 8A:
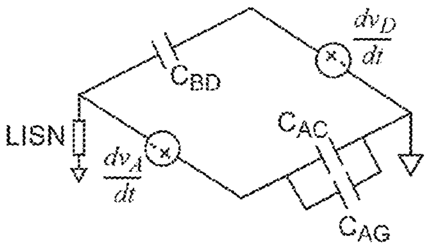
FIG. 8A is a schematic diagram of the structure of FIG. 7 redrawn to emphasize the bridge circuit and the balancing thereof.

However, in accordance with the invention, the transmission of CM current may be balanced in such a manner that CM noise currents may be made to cancel. As shown in FIG. 5A, two layers of shielding are placed between the primary and secondary windings to form shielding 1 and shielding 2 as shown in the axial cross-section of FIG. 5A and a gap 110 dividing each layer of shielding into two parts of similar geometry and each of the parts of both layers are connected to a respective end of the primary and secondary windings, a bridge circuit is formed as schematically illustrated in FIGS. 8 and 8A that may be balanced by the location of the gap such that $$(dv_a/dt)/((dv_a/dt)=C_{BD}/(C_{AC}+C_{AG}).$$

Figure 8B:
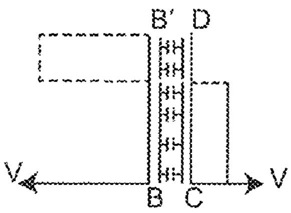
FIG. 8B illustrates the voltage distribution in shielding shown in FIG. 7

The bridge circuit will then be balanced and CM noise current flowing from the primary winding to the secondary winding will be balanced by the CM noise current flowing from the secondary winding to the primary winding. Thus no net CM current will flow. In other words, since the shielding portions are comprised of a conductive foil or the like and only one end is connected, there will be very little voltage drop in any of the shield portions while two of the shield portions or parts are connected to the primary and secondary side grounds. (The voltage distribution due to Faraday's Law, discussed in greater detail below, is relatively small since each shield portion is only a fractional turn, and is not visible at the scale of illustration in FIG. 8B.) Thus, as illustrated in FIG. 8B, the voltage distribution in the parts of the shielding layers that overlie each other and between which parasitic capacitance still exists will be such that no net charging or discharging of the parasitic capacitances occurs and no CM noise current is conducted. Stated somewhat differently, when shielding is placed between the primary and secondary windings of a transformer and connected to one of the primary or secondary windings, the parasitic capacitance between the shielding and the winding to which it is connected can have no effect on the conduction of CM noise although current will circulate between and within the shielding and the winding to which it is connected and a further parasitic capacitance will be formed between the shield and the other winding of the transformer. When separate shielding is applied and connected to each of the primary and secondary windings of a transformer, the parasitic capacitance between the respective windings and shield layers can have no effect on the conduction of CM noise current although current will circulate between the respective shield layers and the winding to which each respective shield layer is connected and a parasitic capacitance will be formed between the shielding layers which is still capable of conducting CM noise. However, the voltage distribution on the respective shielding layers of the parasitic capacitance thus formed by the shielding layers is necessarily of equal magnitude but opposite polarity. When the shielding layers are similarly divided and the respective portions of each shielding layer connected to the windings at locations having a different voltage, approximately or exactly equal and complementary CM currents will flow across the parasitic capacitor in opposite directions yielding approximately or exactly zero net CM current flow in the parasitic capacitance. In other words, the shield portions can be divided at a location to cause the CM currents in opposite directions to be substantially equal in magnitude to balance or cancel each other. Alternatively but not preferably, the respective portions of shielding can be equal in area but connected to points of respective windings where equal voltages will appear.

This balanced condition can be adjusted by changing the position of the gap between the portions of respective shielding layers which can be easily calculated (with sufficient accuracy to meet stringent EMI standards) as part of the transformer or power converter design and readily applied in production or manufacturing environments, regardless of the power converter topology chosen. Alternatively, if $C_{AG}$ is very small, compensation for it may be optionally omitted or, as may be preferred in some power converter designs, a small and possibly variable capacitor can be provided in parallel with $C_{AG}$ together with a relative increase of $C_{BD}$ and relative reduction of $C_{AC}$ (e.g. as over-compensation) and trimmed or adjusted to precisely balance the bridge for optimal elimination of CM noise current conduction.

It should be appreciated from the foregoing that the embodiment of the invention described above is fully generalized and can be applied to any transformer configuration and construction including windings formed of different forms of conductors (e.g. PCB windings, Litz wire and the like) and of any turns ratio. Further, since $C_{AG}$ can be fully compensated, the invention can substantially eliminate CM noise for any configuration of power converter design; thereby greatly increasing design flexibility. Moreover, the simplicity of the shielding configuration is extremely well-suited to mass production manufacturing processes and can be implemented with minimal increase in cost over transformers in which no shielding or shielding in accordance with known techniques is provided. The invention is effective to minimize or eliminate CM noise to meet EMI requirements for loads of virtually any nature while minimizing or eliminating any need for additional filtering.

The inventors have also discovered that the basic principles of the invention can be implemented in a particularly simple manner for transformers and power converters that include PCB windings where the PCB winding is formed of a conductive film on an insulating substrate and single turn PCB windings, in particular, as will now be discussed. Transformers of such construction are substantially ubiquitous at the present time in many, if not most, consumer electronics products and are currently preferred for their robust construction as well as being extremely compact and allowing achievement of greater power density than other transformer constructions.

Figure 9:
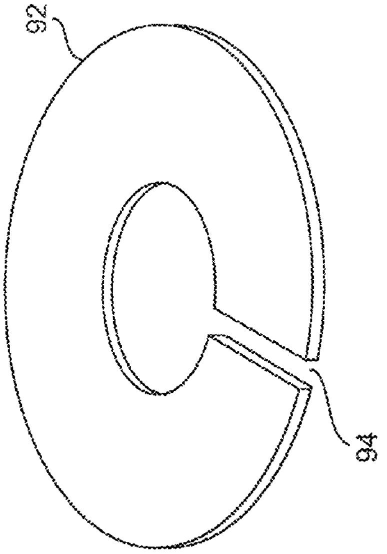
FIG. 9 is an isometric view of a one-turn PCB secondary winding of an exemplary transformer suitable for a power converter application.

The principal drawback of such constructions is the characteristic high inter-winding capacitance because the area of the conductive film must necessarily be relatively large to provide a sufficient cross-sectional area to carry the required current and consequent conduction of CM noise. An isometric view of a single turn PCB winding 92 is shown in FIG. 9 in the shape of an annulus having a gap 94 in which the large area presented by a PCB winding is evident. The large capacitance and the CM noise characteristically conducted thereby often complicates Electromagnetic Interference (EMI) filter design.

Figure 10:
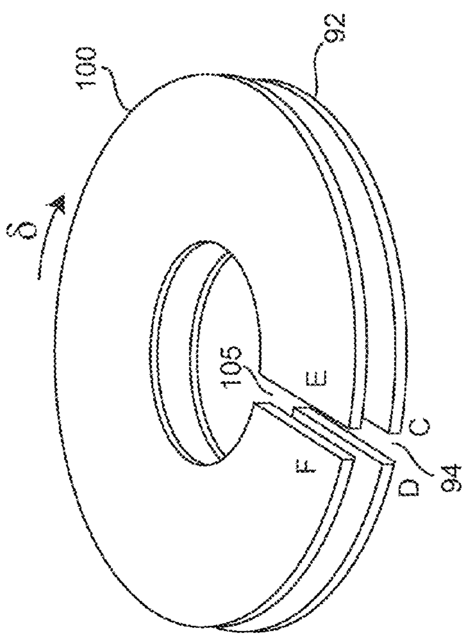
FIG. 10 is an isometric view of shielding in accordance with the invention applied to the PCB winding of FIG. 9.
Figure 11:
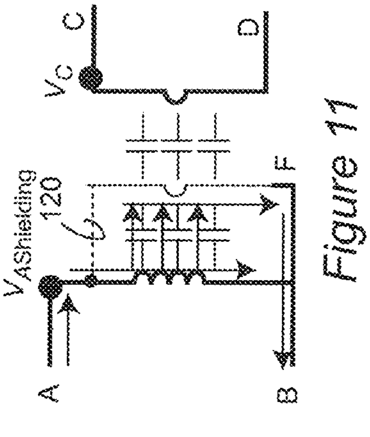
FIG. 11 is a schematic diagram of a transformer including the shielding of FIG. 10.
Figure 12:
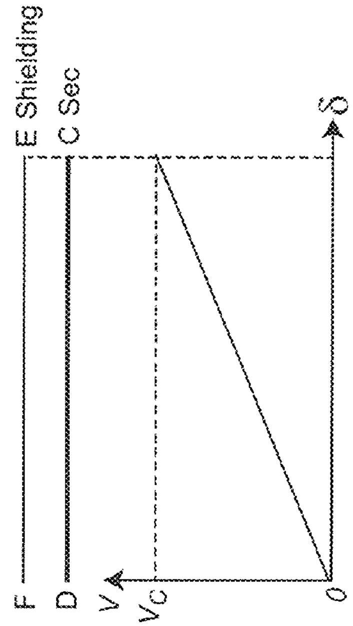
FIG. 12 is a graph of voltage distribution in the PCB winding and shielding of FIG. 10.

Referring now to FIG. 10, shielding 100 in accordance with the invention is shown, together with the PCB winding 92 of FIG. 9 in a similar isometric view with connection points, C, D, E and F, indicated thereon for reference. A schematic diagram of a transformer including a PCB winding shielding in accordance with the invention is illustrated in FIG. 11 in which connection terminals are similarly labeled. Since the PCB winding is arbitrarily designated as a secondary winding (as is usually the case for one-turn windings producing a voltage step-down, as is also commonly the case), the terminals are labeled C and D. The shielding element area 100 is congruent with the area of the winding 92 with gap 105 of the shield aligned with gap 94 of the one-turn winding. Terminal F of the shielding is connected to the connection to terminal B of the transformer primary winding while terminal E is unconnected. The shield element 100 can also be fabricated as a PCB layer and, as a practical matter, it is usually convenient to do so although it could be provided as a discrete element. As discussed above, with known shielding techniques, the noise current circulates between the shield and the primary winding and, hence, the primary winding structure has essentially no effect on the capacitive coupling between the primary and secondary windings of the transformer. The voltage distribution in the shield will be substantially determined by the voltage distribution in the secondary winding in accordance with current induced therein by the current in the primary winding of the transformer causing a magnetic field that links both the secondary winding and the shield. Because the shield is of identical shape and size to the PCB winding and essentially forms a one-turn winding, the voltage appearing over the length of the shield 105 is determined by Faraday's Law and the voltage distribution is assumed to be substantially linear for purposes of this discussion. (Local variations from linearity will be self/canceling.) This voltage distribution is essentially identical to the voltage distribution induced in PCB winding 92 by the magnetic flux generated by the primary winding current as shown in FIG. 12 (which illustrates the voltage distribution along the PCB winding and shield in the direction δ, also applied to FIG. 10 for reference). Because the voltage distribution in the shielding is substantially the same as the voltage distribution in the PCB winding, the parasitic capacitances between the shield 100 and the PCB winding 92 are effectively floating at the same voltage and little, if any, common mode noise current will flow to the PCB winding, even though the parasitic capacitance will remain and may possibly be very large compared to the capacitance between the primary winding and the shield. If the voltage distribution in the shielding and the PCB winding are, in fact, identical, there will be no CM noise current coupled through the transformer, at all. That is, in the case of a one-turn coil, the voltage distribution in the shield due to Faraday's Law will tend to counteract the conduction of CM noise and can be balanced by the congruence of the shielding with the one-turn coil which is particularly simple for a PCB winding structure.

It should be noted that the interposition of a shield between the primary and secondary coils essentially converts the distributed parasitic capacitance into a distributed capacitive voltage divider. However, since the voltage distribution in the PCB winding and shield is principally determined by the current induced in the PCB winding by the normal magnetic coupling of the windings of the transformer in accordance with Faraday's Law, any variation from the respective voltage distributions being identical will be principally due to a difference in magnetic flux coupling the secondary winding and the shield. Therefore, the ratio of capacitances in the capacitive voltage dividers due to spacing or variation of spacing between respective points of the shield and secondary coils is of little, if any effect and spacing of the shield and secondary winding is not critical to the practice of the invention other than to ensure that the magnetic flux linking the shield is as close as possible to the flux linking the secondary coil regardless of the construction of the primary winding to which the shield is connected.

It should be understood that the embodiment of the invention described above is simplified and assumptions have been made to simplify the description and facilitate conveying an understanding of the invention. For example, the PCB winding has been assumed to be the secondary winding while the same principles of operation would apply if the PCB winding was, in fact, the primary winding. It should also be understood that the embodiment described above, for practical reasons having nothing to do with the principles of operation of the invention, is unlikely to be preferred in most applications; an example of which will be alluded to below in connection with FIGS. 15 and 16. However, the principles of the invention can be applied to other circumstances as will now be described and which will enable the invention to be applied to virtually any transformer structure with one or more PCB windings of any configuration, construction or materials and with shielding in any arbitrary rotational orientation thereto.

Figure 13:
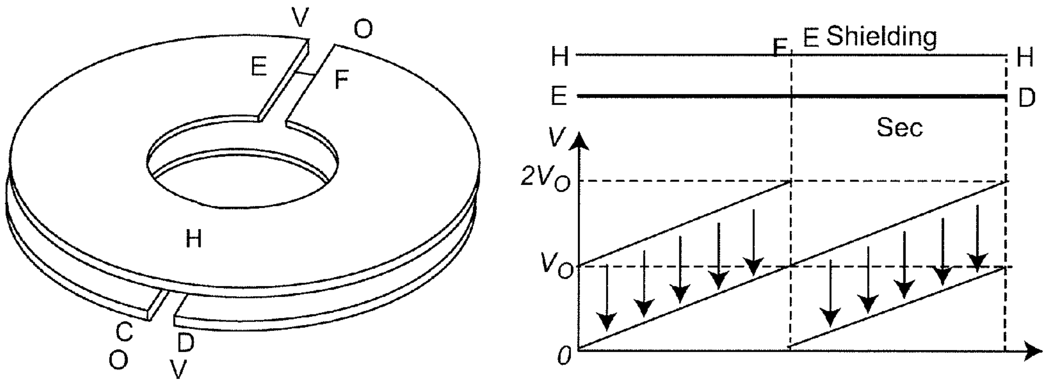
FIG. 13 illustrates a different orientation of shielding with respect to a PCB winding and a graph of voltage distribution in the PCB winding and the shielding.

For example, the gap in the PCB winding and shield need not be aligned as shown in FIG. 10 but could be rotated by 180° relative to each other, as shown in FIG. 13, as long as the PCB winding and shield approximately overlie each other. In such a case, the voltage distribution in the shield would be larger than the voltage distribution in the PCB winding over one half of the shield and PCB winding and, in the other half, the voltage distribution in the shield would be less than the voltage in the PCB winding, as graphically depicted on the right-hand side of FIG. 13. That is, the voltage distribution at any given point in the shielding will be different from the voltage distribution at the corresponding point on the PCB winding. These differences in voltage causes CM current to flow in the shield and the PCB winding but the current flow between them is in opposing directions such that the net CM current is zero. That is, the CM current circulates only between the PCB winding and the shielding and no net CM noise current is transmitted through the transformer.

Figure 14:
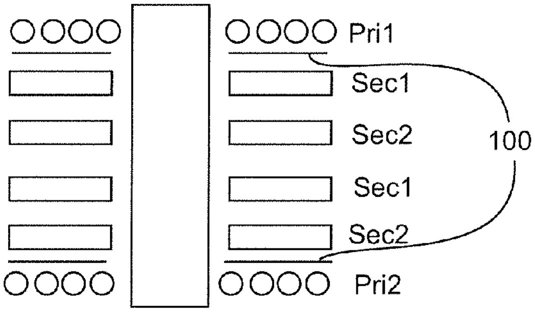
FIG. 14 is a schematic illustration of shielding in accordance with the invention as applied to a different transformer winding structure including plural PCB windings.

It should also be understood that the PCB winding can comprise more than a single turn since the shield (with any rotational displacement that may be necessary or convenient) can be made to overlie the PCB winding and be connected to the zero voltage or ground terminal of the other winding. If desired, the shield may also be formed as a multi-turn winding such as by providing multiple layers of shielding connected in series. For example, an exemplary transformer structure having more than a single turn of PCB wiring is shown in FIG. 14. In this exemplary transformer which is suitable for use in the power converters shown in FIGS. 15 and 16, the two coaxial primary windings are serially connected (possibly providing for a center tap) while the secondary windings comprise four PCB single turn windings with the two Sec.1 PCB windings and the two Sec.2 PCB windings being connected in parallel (for greater current-carrying capacity and the pairs of Sec.1 and Sec.2 windings being connected in series to provide a center-tapped secondary winding configuration. Further, as with the above, initially-described single-turn winding embodiment, if the primary side winding is a PCB winding and has fewer turns than the secondary winding, the shielding can be connected to the secondary side zero voltage or ground point and made congruent to and overlying the primary winding. In such a case, the CM noise current coming from the secondary side is circulating between the secondary winding and the shielding and no net CM current flows to charge or discharge the parasitic capacitance of the shield and the primary winding.

In a further embodiment of the invention the shielding can be made as a part of the primary winding by connecting the shielding in parallel with the primary winding or a portion thereof as depicted by dashed line 120 in FIG. 11 although the shield is of the same geometry and overlying the secondary winding. Such a configuration may be useful in transformer or converter designs in which a different level of magnetic flux links the shield than links the secondary winding. Because the shielding is part of the primary winding, CM noise coming from the primary side circulates only between the primary winding and shield and substantially no CM noise current flows to the secondary side of the transformer. In summary, as long as the shielding is connected to the primary or secondary winding and of the same geometry and overlies the secondary or primary winding, respectively, there is substantially no CM current flow through the transformer; thus fully overcoming the principal drawback of transformers including a PCB winding.

To further illustrate the application of the invention to additional embodiments, consider a 400V to 12V, 300 W LLC resonant power converter which has been built. The transformer structure is schematically depicted in FIG. 14. Primary winding 1 and primary winding 2 are formed of Litz wire, a type of cable used to carry alternating current that comprises many fine strands of wire that are individually insulated and twisted or woven together in a carefully prescribed pattern that equalizes the proportion of the overall length over which each strand is at the outside of the cable, and are connected in series. The secondary windings are formed as two pairs of PCB windings and the windings of each pair are in parallel with the two pairs connected in series with the center tap at the series connection node. Shielding is placed between the first primary winding and the first winding of the first pair of secondary windings and between the second primary winding and the second winding of the second secondary winding pair as shown in FIG. 14.

Figure 15:
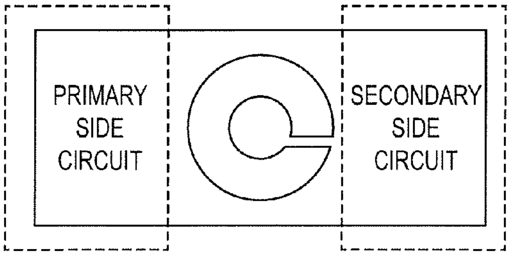
FIGS. 15 and 16 are views of a power converter with shielding applied in different orientations.

FIG. 15 shows a view of this power converter with the transformer structure depicted in FIG. 14 in a central portion thereof with the upper primary winding removed. The primary side and the secondary side of the converter are located to the left and right of the transformer, respectively. As can be readily understood, the terminals of the primary windings of the transformer will be connected to the primary side of the converter and the terminals of the secondary winding will be connected to the secondary side of the converter. Therefore gap 45 of the PCB winding layers of the secondary winding will be located to face the secondary side of the converter (e.g. to the right in FIG. 15).

Figure 16:
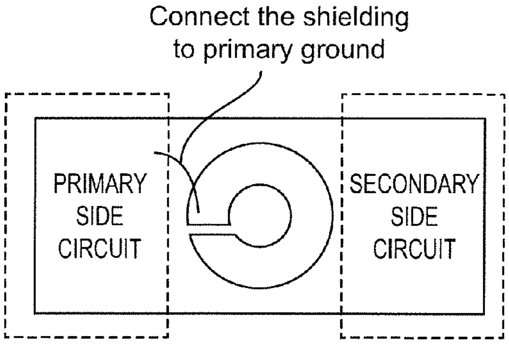

If the shield is oriented identically to the secondary PCB winding layers, as discussed above, the required connection of a terminal of the shield, adjacent gap 105 (which faces the secondary side of the converter), to one of the primary winding terminals, as shown in FIG. 15, is difficult, if not impossible without interfering with the primary winding and the function of the transformer. Therefore, it is deemed preferable to rotate the shield layers as discussed above in connection with FIG. 13 to substantially align the connection points of the shield and the primary winding in a direction parallel to the transformer axis, as shown in FIG. 16, such that the connection cannot interfere with the upper primary winding or the operation of the transformer.

Figure 17:
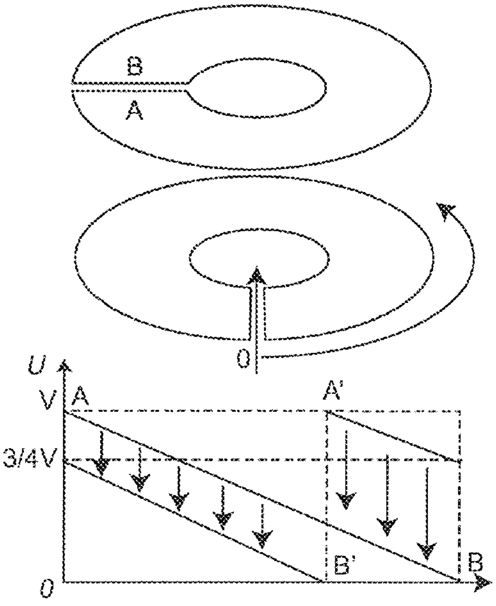
FIGS. 17 and 18 illustrate further different relative PCB winding and shielding orientations and the resulting voltage distributions in the PCB winding and shielding.
Figure 18:
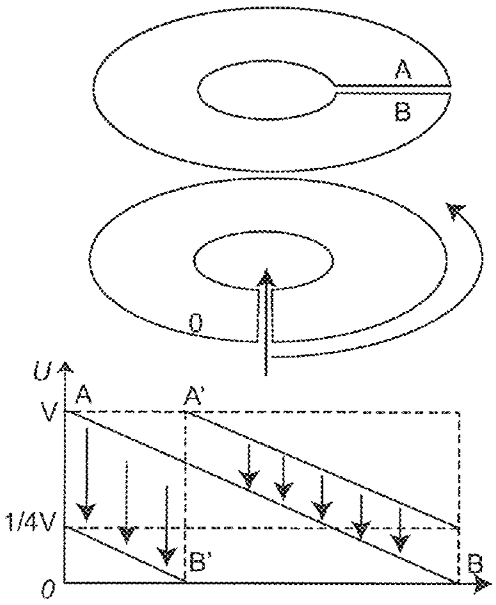

It should be understood that other power converter design geometries may make rotational orientation of the shield at angles other than 180° to be more convenient or appropriate. To fully generalize the application of the invention to PCB windings, it can be appreciated that the respective areas over which CM currents in opposing directions occur (as in the generalized embodiment of the invention discussed above in connection with FIGS. 1-8B), in the case of PCB windings and voltage distributions in the shield developed in accordance with Faraday's Law, the magnitude of the difference in voltage distribution varies inversely with the area over which CM currents in respective directions occur, as depicted in FIGS. 17 and 18 and any angular displacement of the gaps in the PCB winding and shield will yield substantially the same result of avoiding transmission of CM current outside the PCB winding and shield structures.

Figure 19A:
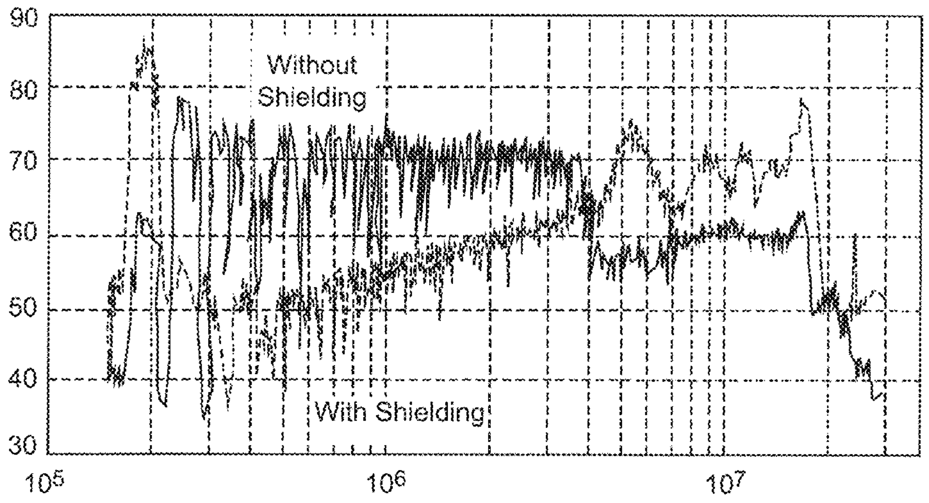
FIGS. 19A, 19B and 20 are graphical comparisons of experimental results in regard to CM noise with and without the invention.
Figure 19B:
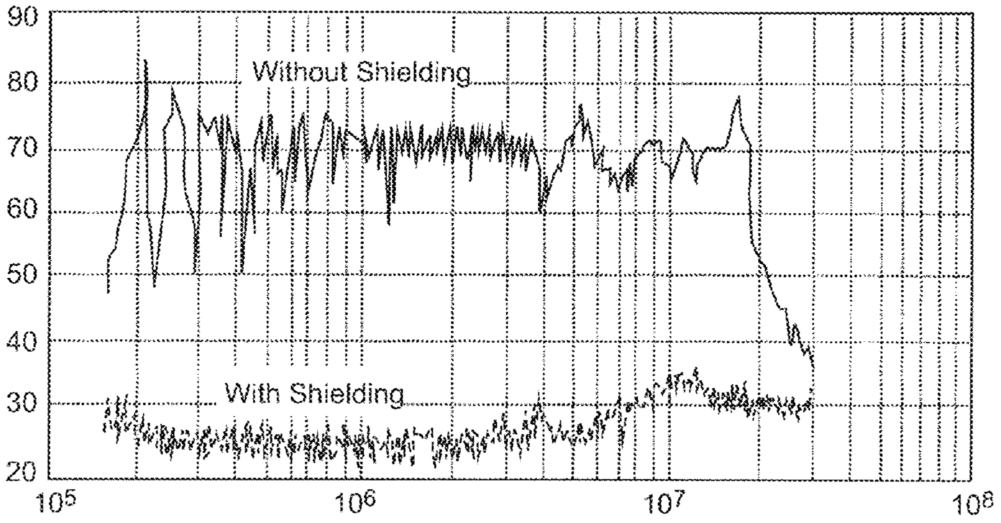
Figure 20:
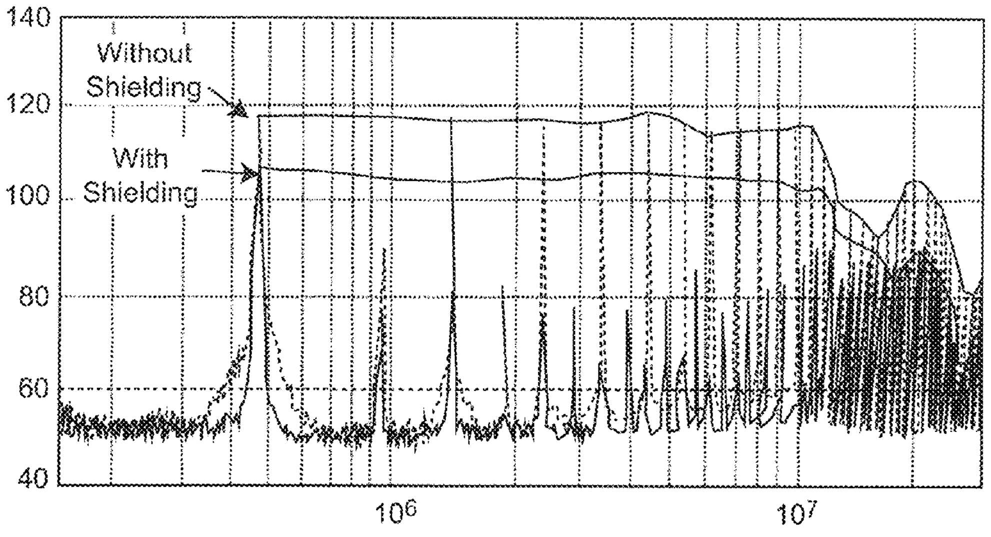
Figure 21:
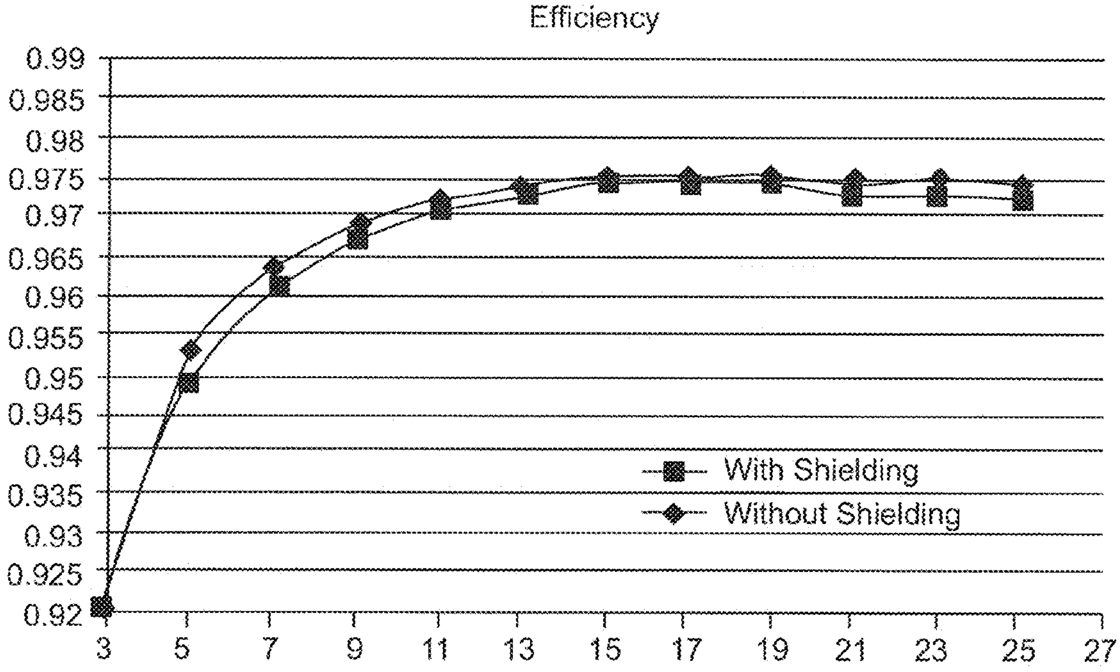
FIG. 21 is a graphical comparison of transformer efficiency with and without the invention.

The experimental results of operation of this prototype power converter including shielding in accordance with the invention as discussed above in connection with FIGS. 7-8B are compared to results of operation without the shielding in FIGS. 19A, 19B and 20. As shown in FIG. 19A, where balancing of $C_{AG}$ is omitted there is a frequency dependent but very substantial reduction in transmitted CM noise varying between 10 dB and 20 dB using the generalized two-layer shielding described above. In FIG. 19B, balancing of $C_{AG}$ is included and exhibits greater reduction in transmitted CM noise and less frequency dependence. As shown in FIG. 20, there is a 10 dB reduction in transmitted CM noise current employing single layer shielding in conjunction with one or more PCB windings in accordance with the invention. FIG. 21 shows that there is only a very slight reduction in efficiency of the transformer when shielding in accordance with the invention is added.

In view of the foregoing it is clearly seen that the invention provides a technique to provide substantially complete isolation of primary and secondary windings of any transformer of any design and any materials or winding construction and substantial avoidance of transmission of common mode noise through unavoidable parasitic capacitances between windings of a transformer. The basic principles of the invention can also the extended to allow balancing and cancellation of common mode noise through any other parasitic capacitance that may bypass the transformer. Therefore, the invention provides an apparatus and method by which common mode noise can be reduced to very low levels; allowing EMI filtering to be reduced and simplified in virtually any electrically powered device.

While the invention has been described in terms of a single preferred embodiment and a special case of application of the principles of the invention to PCB windings, those skilled in the art will recognize that the invention can be practiced with modification within the spirit and scope of the appended claims.

Having thus described our invention, what we claim as new and desire to secure by Letters Patent is as follows:

1. A method for reducing or eliminating conducted common mode noise in a transformer having primary and secondary windings, said method comprising steps of:

interposing a shield member between said primary and secondary windings of said transformer to form a parasitic capacitance between said shield member and said secondary winding or a further shield member;

developing a voltage distribution in said secondary winding or said further shield member interposed between said shield member and said secondary winding; and connecting said shield member to said primary winding such that a voltage distribution is developed in said shield member wherein said voltage distribution developed in said shield member and said voltage distribution developed in said secondary winding or said further shield member are substantially equal or cause substantially complementary currents in said parasitic capacitance between said shield member and said secondary winding or said further shield member such that net common mode current in said parasitic capacitance is substantially eliminated.

2. The method as recited in claim 1 comprising the further steps of:

dividing said shield member and said further shield member into opposing portions proportionately in accordance with a turns ratio of said transformer; and cross-connecting said opposing portions of said shield member and said further shield member to terminals of said transformer.

3. The method as recited in claim 1, comprising the further steps of:

dividing said shield member and said further shield member into equal opposing portions; and cross-connecting said opposing portions of said shield member and said further shield member to points of respective primary and secondary windings of said transformer having substantially equal voltages.

4. The method as recited in claim 1, wherein said secondary winding is a printed circuit board (PCB) winding, said shield member has an identical shape to said PCB winding, and said voltage distribution in said shield member is principally developed in accordance with Faraday's Law such that a voltage distribution in portions of said shield member approximate a voltage distribution in portions of said PCB winding.

5. The method as recited in claim 4, including the further step of rotationally orienting said shield member relative to said PCB winding such that said connection of said shield member to said primary winding does not affect transformer operation.

6. The method as recited in claim 5, wherein said shield member is rotationally oriented 180° from a rotational orientation of said PCB winding.

7. The method as recited in claim 4, wherein said PCB winding is a single turn winding.

* * * * *